United States Patent [19]

Owen et al.

[11] Patent Number: 4,463,265

[45] Date of Patent: Jul. 31, 1984

[54] ELECTRON BEAM PROXIMITY EFFECT CORRECTION BY REVERSE FIELD PATTERN EXPOSURE

[75] Inventors: Geraint Owen; Paul Rissman, both of Palo Alto, Calif.

[73] Assignee: Hewlett-Packard Company, Palo Alto, Calif.

[21] Appl. No.: 389,306

[22] Filed: Jun. 17, 1982

[51] Int. Cl.³ .............................................. H01J 3/00
[52] U.S. Cl. ................................ 250/492.2; 250/398; 430/296
[58] Field of Search .......................... 250/492.2, 398; 430/296, 328

[56] References Cited

U.S. PATENT DOCUMENTS 3,681,103 8/1972 Brown .................................. 430/296
3,971,860 7/1976 Broers .................................. 430/296
4,264,711 4/1981 Greeneich .......................... 430/296

Primary Examiner—Bruce C. Anderson
Attorney, Agent, or Firm—John A. Frazzini

[57] ABSTRACT

In electron beam lithography, a beam of incident electrons exposes a preselected circuit pattern in a thin resist layer deposited on top of a substrate to be etched. Some of the electrons scatter from the substrate back into the resist layer producing an undesired exposure which produces variable resolution of features. In accordance with the disclosed technique, the region of the resist which is complementary to the desired circuit pattern is also exposed by an electron beam which has been adjusted to produce an exposure approximating that due to backscattering. This additional exposure removes the spatial variability in resolution attainable by the electron beam lithography.

8 Claims, 11 Drawing Figures

ELECTRON BEAM PROXIMITY EFFECT CORRECTION BY REVERSE FIELD PATTERN EXPOSURE

BACKGROUND OF THE INVENTION

The disclosed invention relates in general to electron beam lithography and more particularly to errors in such lithography introduced by backscattered electrons. In electron beam lithography, a substrate which is to be patterned is first covered by a thin layer of resist which is sensitive to bombardment of electrons supplied in an electron beam incident on the resist. These electrons decelerate as they pass through the resist thereby depositing energy in the resist along the trajectories of each of these electrons. In its forward path through the resist, energy is deposited in a cylinder of diameter somewhat greater than the diameter of the electron beam. The energy deposited in this way is known as the "forward scattered" energy and has a distribution as a function of the lateral displacement from the center of the beam of the form shown by curve 11 in FIG. 1.

In general the electrons in the electron beam must pass entirely through the resist layer and on into the substrate so that the entire thickness of the resist layer is exposed by the electron beam. In addition, if the initial energy of the incident electrons were such that the electrons come to rest in the resist, then charge would build up in those localized regions where the beam has been incident on the resist. Because localized regions of charge in the resist will deflect the electron beam, portions of the circuit pattern which have already been written by the electron beam would affect the portions of the circuit pattern which are subsequently drawn. Such deflection would result in errors in the pattern which is to be etched into the substrate. Therefore, the energy of the incident electron beam is typically chosen to be sufficient to insure that the electrons pass through the thin resist layer into the underlying substrate. Because the conductivity of the substrate is typically much higher than that of the resist, a localized charge build-up in the substrate will not result. In addition, the charge can be removed from the substrate by grounding the substrate. Typically, an energy on the order of 20 keV is sufficient to insure that the electrons pass through the thin resist layer as well as any non-conductive layer between the resist and substrate.

Unfortunately, the incident electrons are scattered by the atoms in the substrate so that a significant fraction of the incident electrons are scattered back into the resist film producing an undesirable exposure of the resist layer. The effect of the scattering by the substrate atoms is illustrated in FIG. 2 in which the calculated trajectories (utilizing Monte Carlo simulations presented in the article by D. Kyser and K. Murata in the article entitled "Monte Carlo Simulation of Electron Beam Scattering and Energy Loss in Thin Films on Thick Substrates" and published in Proceedings of the Sixth International Conference on Electron and Ion Beam Science and Technology Electrochemical Society, 1974, pp 205-223) are presented of one hundred 20 keV electrons incident on a 0.4 micron layer of PMMA resist on top of a silicon substrate. The energy deposited in the resist by the backscattered electrons is known as the "backscattered energy" and has a distribution as a function of the lateral displacement from the center of the beam of the form shown by curve 12 in FIG. 1. The total energy deposited by both forward and backscattered energy is shown as curve 13. The extra exposure of the resist by these backscattered electrons is known as the proximity effect and can significantly affect resolution of circuit features on the order of 1 micron or less. For an incident beam having a width on the order of 0.5 microns, the radius of the region exposed by the backscattered electrons is on the order of 3 microns. The ratio of the backscattered energy to the forward scattered energy is represented by nE. Typically, nE lies in the range from 0.7 to 0.9 for a single layer of resist on the order of 1 micron thick.

The effect of the backscattered electrons on resolution is illustrated in FIGS. 3A-3C which correspond to a situation in which a set of seven parallel lines A-G of equal linewidth and spacing are drawn on the resist by the electrom beam. The curves in FIGS. 3A-3C represent the distribution of energy deposited in the resist as a function of the lateral displacement along the surface of the resist in a direction perpendicular to the direction of the lines. Curves 31A-31G represent the forward scattered energy corresponding to lines A-G respectively, curves 32A-32G represent the backscattered energy corresponding to each of lines A-G respectively, curve 33 represents the total backscattered energy deposited in the resist by all of the backscattered electrons, and curve 34 represents the total energy deposited in the resist by both the forward scattered and backscattered electrons. It should be noted that the forward scattered energy distributions corresponding to each of the lines do not significantly overlap but the backscattered energy distributions corresponding to each of the lines do significantly overlap and result in a greater total backscattered energy in regions surrounded by other lines than for isolated lines or in regions near the edge of a group of lines.

The effect of the backscattered energy on resolution can be seen by examination of FIG. 3C. The curve in that figure represents the total energy (ie. both backscattered and forward scattered energy) deposited in the resist as a function of the lateral displacement. It is the total energy distribution which governs the way the resist dissolves during development of the resist. As is shown in that figure, because the backscattered energy is not uniform the heights of the peaks in the lines A-G are not equal. Similarly, the amount of exposure in the spaces between adjacent lines is also not uniform. Because the peak corresponding to line D is higher than the peak corresponding to line A, upon development of the resist, line D will be wider than line A. Similarly, the resist remaining in the space between line C and D after development of the resist will be thinner than the resist remaining in the space between lines A and B. The exposure by the backscattered electrons therefore produces a variable resolution which is a function of the pattern being drawn.

Three methods which have been proposed to compensate for the proximity effect are: compensation by dose correction, compensation by shape correction and compensation by the use of multi-level resist films. In compensation by dose correction, lines A and G would receive the highest dose of electrons, lines B and F would receive the next highest dose, lines C and E would receive the next highest dose and line D would receive the smallest dose. The dose selected for each of the lines could be chosen to equalize the heights of the peaks corresponding to lines A-G (see FIG. 4A). Alternatively, these doses could be selected to equalize the heights of the valleys between each of these peaks (see FIG. 4B) or could be selected to minimize some other parameter representing the effect of the backscattered energy. The dose can be controlled by regulating the beam current or by regulating the writing speed of the beam. In compensation by shape correction, the pattern which is actually drawn by the electron beam is altered slightly from the ideal pattern which is to result. This pattern is altered to make the total energy exposure have constant magnitude along the boundary of the ideal circuit pattern so that when the resist is developed a near ideal pattern will result. (See Carole I. Youngman and Norman D. Wittels, "Proximity Effect Correction in Vector-Scan Electron Beam Lithography" SPIE, Vol. 35 Developments in Semiconductor Microlithography III (1978), p. 54.). In compensation by the use of a multi-level resist, an electron absorbing layer is interposed between the resist layer and the substrate to reduce the amount of backscattered energy deposited in the resist layer.

Unfortunately, each of the compensation techniques has some serious disadvantages. A first disadvantage is that each of them only incompletely compensates for the backscattered energy distribution. In the case of multilevel resist films, there is some backscatter from the interposed absorbing layer and only partial reduction of the backscattered energy from the substrate. Additional processing steps must also be included to transfer the pattern produced in the thin top resist layer through the interposed absorbing layer to the substrate. As a consequence, the cost of the integrated circuit fabrication process is raised and its yield is lowered. The steps of transferring the pattern to the substrate can also produce undesired broadening or narrowing of features thereby adversely affecting resolution.

In the other two compensation techniques the corrections have to be computed for the particular pattern in question. That computation is typically a prohibitively lengthy and expensive process. In order to make the computation tractable, the pattern data must be partitioned. This is a difficult procedure and can cause unsatisfactory proximity effect corrections to be calculated in regions of the pattern which are near to the partition boundaries. In addition, the choice of the partition size can be ambiguous and can lead to errors. In order to achieve satisfactory compensation, the number of sections in the partition can be quite large thereby requiring a significant increase in the amount of data that must be stored to generate a pattern. The optimum correction is also a function of the resist and developer parameters thereby further complicating the computations. It has proved difficult to devise a computation technique which does not involve operator intervention, especially for patterns other than very simple ones. In the case of dose compensation, it must be possible to vary either the beam current or the writing speed of the electron beam lithography machine as the pattern is being written. This makes the design of the machine more complex than would otherwise be required. A compensation technique is therefore needed which produces a complete or nearly complete compensation for the proximity affect without unduly increasing the cost of circuits produced utilizing this technique because of added processing or design costs.

SUMMARY OF THE INVENTION

In accordance with the illustrated preferred embodiment a technique is presented which compensates for the reduction in resolution due to the proximity effect. In this technique, a reverse field pattern is defined as the negative of the circuit pattern to be drawn—that is, it is the region of the resist which is not exposed by forward scattered energy during the generation of the circuit pattern. In order to compensate for the backscattered energy deposited in the resist during the generation of the circuit pattern, the beam width and intensity are adjusted to produce an energy distribution in the resist that is essentially equal to that of the backscattered energy distribution and then the reverse field pattern is exposed by the electron beam. This exposure of the reverse field pattern produces an essentially constant distribution of total backscattered energy across the circuit so that no variable line resolution is introduced by the backscattered energy.

This technique has several important advantages over previous compensation techniques. No computation of corrections is required before exposing the pattern on the electron beam lithography machine. No additional pattern data storage is required to apply the proximity effect correction. It is not necessary to vary dynamically the beam current or writing speed of the electron beam lithography machine to apply the correction. The correction also does not depend on the chemical parameters of the resist in which the exposure has been made. The technique also produces an essentially complete compensation for the unwanted exposure by the backscattered electrons.

DESCRIPTION OF THE PREFERRED EMBODIMENT

In an electron beam lithography process the area to be exposed is divided into a two dimensional array of squares, known as pixels, and the electron beam can be controlled to expose only selected pixels to generate a desired circuit pattern. For example, for a 5 mm × 5 mm region, the region can be divided in 108 0.5 micron × 0.5 micron pixels. In a raster scan type of lithography machine, the pixels are scanned a row at a time and the beam is turned on only while pixels which are to be exposed by the electron beam are being scanned. The current density in an electron beam varies approximately as a Gaussian distribution—that is, the current density $J(r)$ is approximately equal to $A*\exp(-\ln 2*R2/R2)$ where A is the current density at the center of the beam, r is the radial distance from the center of the beam and R is the radial half-width (is the distance at which the current density is ½ the density at the center of the beam). Because the current density of the beam is approximately Gaussian, so too is the forward scattered energy distribution.

Figure 5A:
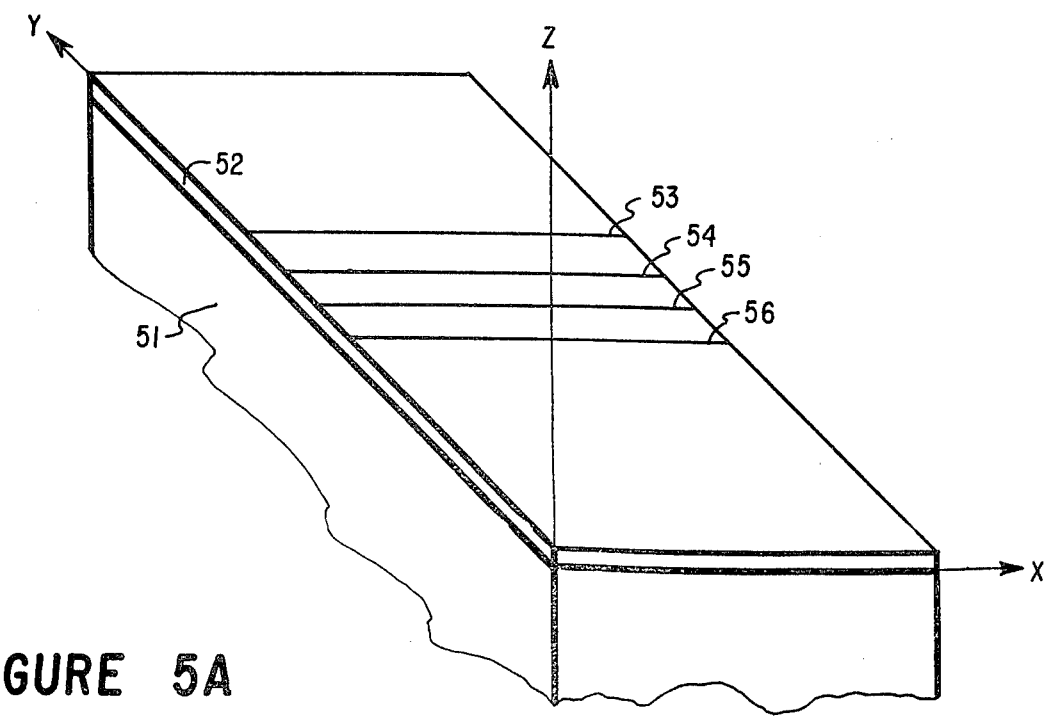
FIGS. 5A and 5B show the relation between pixel size and the value of the half-width of the forward scattered energy distribution.
Figure 5B:
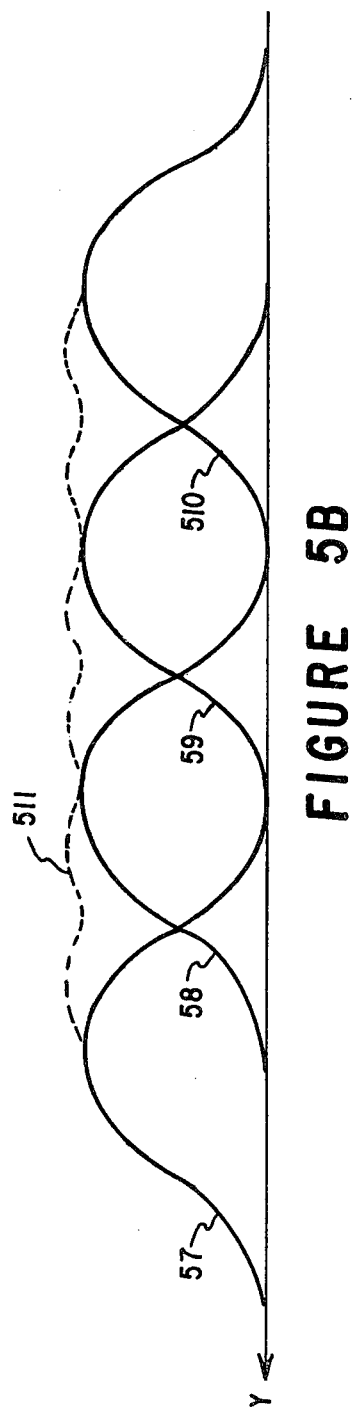

R is typically chosen to be equal to ½ the linear size of a pixel so that at the midpoint between two adjacent pixels which have been exposed, the current densities from these two exposures will add to produce a total density at that point essentially equal to the density at the center of either of these exposed pixels. Likewise, the distribution drops off fast enough that there is substantial overlap only between distributions in adjacent pixels. This choice of R is illustrated in FIGS. 5A and 5B. In FIG. 5A is shown a substrate 51 on which a thin resist layer 52 has been deposited. The coordinate axes in that figure are selected so that the top surface of the resist lies in the x-y plane. The resist pattern is generated by exposing the resist with an electron beam which typically impinges essentially perpendicular to the resist surface although it could impinge at another angle if desired. Indeed, the beam is guided over the wafer by deflecting it at a deflection point so that the angle of incidence of the beam on the wafer varies by about 2 degrees as the beam scans across the wafer. This figure illustrates the situation in which four adjacent rows of pixels 53-56 have been exposed in a raster scan type of machine. The x-axis has been selected to be parallel to these lines.

The effect of the choice of R on the exposure distribution for the case shown in FIG. 5A is illustrated in the cross sectional view of FIG. 5B. The forward scattered energy distributions corresponding to each of the lines 53-56 are represented as curves 57-510, respectively. The total forward scattered energy distribution from all four lines is represented by curve 511 which illustrates that over the region from the center of line 53 to the center of line 56 the total forward scattered energy distribution is nearly constant. Therefore, a nearly constant energy distribution over solid regions such as regions KLMN and PQRSTU shown in FIG. 6 can be produced by exposing only those pixels which are contained within the solid regions. The amount of variation from constant energy distribution could be decreased by selecting R to be larger than ½ the linear size of a pixel, but the associated increase in the number of lines which must be scanned is not typically compensated for by the improvement in exposure uniformity.

The backscattered energy distribution resulting for a very narrow incident beam can likewise be approximated by a Gaussian distribution. For an incident beam which does not have a negligibly small width, the resulting backscattered energy distribution is the convolution of the current density distribution for the beam with the backscattered energy distribution corresponding to a very narrow beam. Gaussian distributions have the property that the convolution of two Gaussian distributions is also a Gaussian distribution having a half-width which is the square root of the sum of the squares of the half-widths for the Gaussian distributions which were convolved. Therefore, for a beam current density distribution which produces a forward scattered energy distribution having a half-width $R_f$, the half-width $R_b$ for the resulting backscattered energy distribution is $\sqrt{R_f^2 + R_g^2}$ where $R_g$ is the half-width of the backscattered energy distribution corresponding to a very narrow beam.

Figure 1:
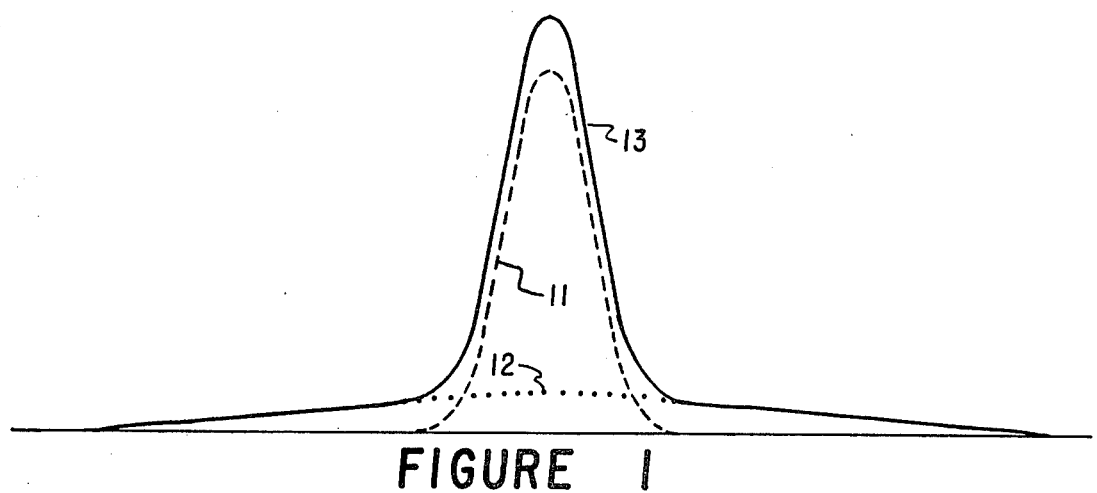
FIG. 1 shows the energy distributions as a function of the lateral displacement from the center of an electron beam of the forward scattered energy and the backscattered energy.
Figure 2:
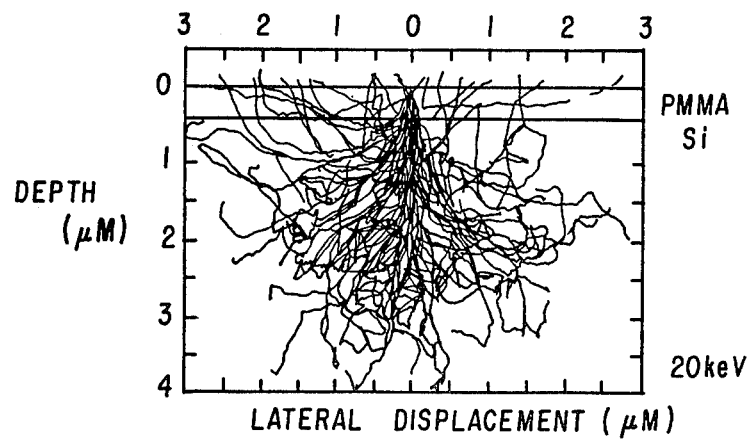
FIG. 2 shows the calculated trajectories (utilizing Monte Carlo simulations) of one hundred 20 keV electrons incident on a 0.4 micron layer of PMMA on top of a silicon substrate.
Figure 3A:
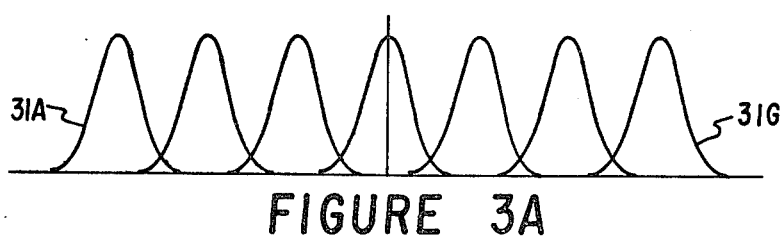
FIGS. 3A-3C show the energy distributions which result in a thin resist layer on top of a substrate when seven closely spaced lines are drawn by an electron beam lithography machine.
Figure 3B:
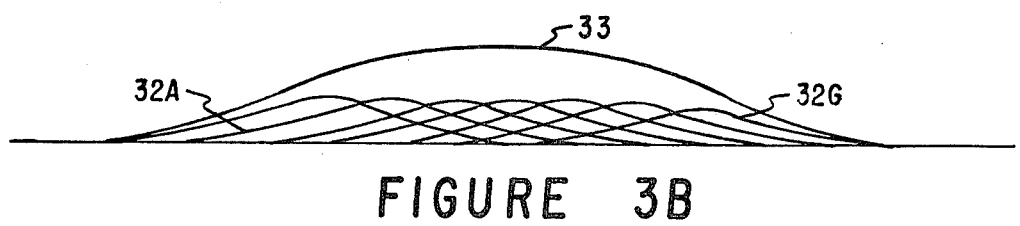
Figure 3C:
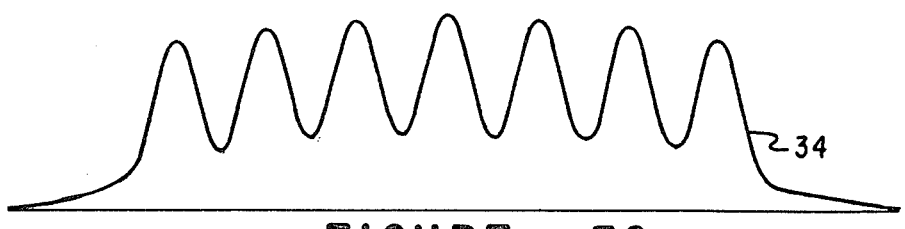
Figure 4A:
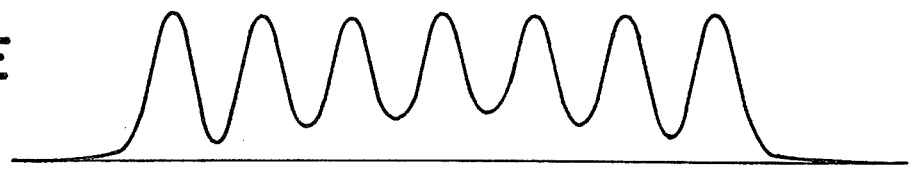
FIGS. 4A and 4B show the total energy distributions which result in a thin resist layer on top of a substrate when seven closely spaced lines are drawn by an electron beam lithography machine and the proximity effect is compensated by a dose correction technique.
Figure 4B:
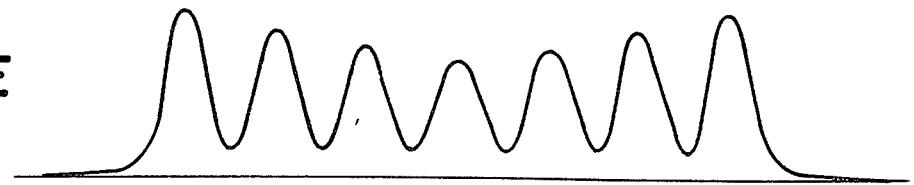
Figure 4C:
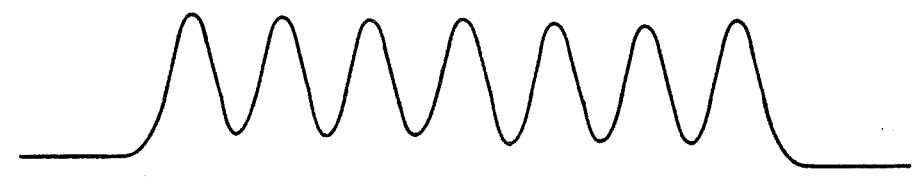
FIG. 4C shows the total energy distribution which results in a thin resist layer on top of a substrate when seven closely spaced lines are drawn by an electron beam lithography machine and the proximity effect is compensated by reverse field pattern exposure in accordance with the disclosed invention.

The simulation shown in FIG. 1 indicates that $R_b$ is on the order of 3 microns. Therefore, for 0.5 micron by 0.5 micron pixels there is a significant amount of overlap of the backscattered energy distributions from exposed pixels within a radius of about 6 microns surrounding a point of interest in the circuit. Therefore, the total backscattered energy distribution at a point of interest in the circuit is a function of the pattern which has been exposed within a circle of approximately 6 microns surrounding that point. Thus, the total backscattered energy distribution is a complicated function of the circuit pattern being drawn by the electron beam lithography machine. This is why it is so complicated to accurately calculate the variations in dose or width which need to be used in the dose correction or shape correction compensation schemes discussed in the Background of the Invention.

The primary problem associated with the total backscattered energy distribution is that it is not constant so that it affects different parts of the circuit differently. Because the total backscattered energy distribution varies spatially, it will cause a greater narrowing of some circuit features than it will other features. Such narrowing can locally affect circuit parameters such as resistivity, power dissipation and capacitance so that circuit performance can be affected in a way which can be predicted only by adequately estimating the total backscattered energy distribution. The present compensation scheme avoids the need to make this very complicated estimate.

Figure 6:
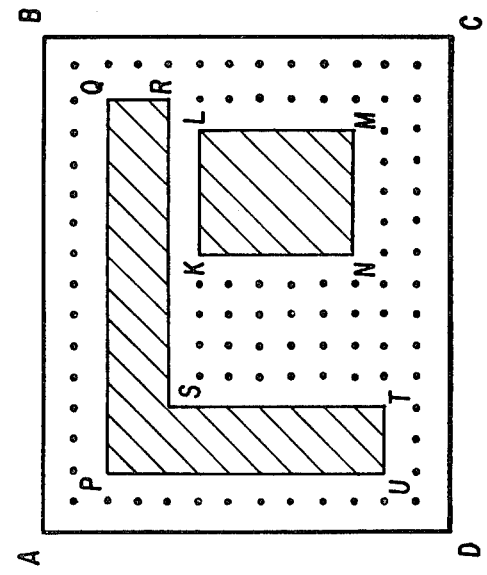
FIG. 6 illustrates the meaning of "reverse field pattern".

The present compensation scheme can be understood by reference to FIG. 6. In that figure, a very simple pattern is presented in which the only areas subjected to exposure by the electron beam are the solid regions KLMN and PQRSTU (ie. the two cross hatched regions). The reverse field pattern consists of those regions which have not been exposed by the electron beam in generating the pattern. In FIG. 6, the reverse field pattern (shown as the dotted region) consists of the region ABCD excluding the regions KLMN and PQRSTU. In accordance with the present compensation scheme, the circuit pattern regions (ie. regions KLMN and PQRSTU) are first exposed by the electron beam. The intensity and width of the beam are then adjusted so that the total energy distribution which results in each pixel which is exposed closely approximates the backscattered energy distribution and then the reverse field pattern is exposed by this adjusted beam. This scheme results in a total energy distribution which is the sum of two components: (1) a first component which is the ideal distribution which would result if there were no proximity effect and only the circuit pattern (ie. regions KLMN and PQRSTU) were exposed and (2) a second component which is an essentially constant energy distribution over the entire region ABCD generated by producing in every pixel an energy distribution approximating that of the backscattered energy distribution. Thus the exposure of the reverse field pattern results in an energy distribution in the resist which complements the backscattered energy distribution (produced by the proximity effect during the exposure of the circuit pattern) to produce the essentially constant second component.

Because the second component is essentially constant, it will not introduce any variability in the resolution of the circuit pattern produced by the first component. It will instead be equivalent to a constant background exposure of the resist. Although such constant exposure will somewhat wash out the pattern produced by the forward scattered energy, the amount of washing out will be comparable to that already present at points of the pattern having a significant fraction of their neighboring regions (ie. within about a 6 pixel radius of these points) exposed by the forward scattered energy.

In one simple procedure for adjusting the beam for the exposure of the reverse field pattern, the beam is defocussed a controlled amount to produce a Gaussian forward scattered energy distribution of adjusted half-width $R_{fa}$. The energy deposited per unit area is adjusted by adjusting the current density of the beam. Alternatively, the energy deposited per unit area can be adjusted by adjusting the writing speed of the beam. Because the defocussed beam will also have an associated backscattered energy distribution, the choice of Rfa and adjusted amplitude Afa are chosen to make the resulting total energy distribution approximate the backscattered energy distribution. That is, during the production of the circuit pattern, the forward scattered energy distribution is $A_f * \exp(-\ln 2 * r^2/R_f^2)$ and the backscattered energy distribution is $A_b * \exp(-\ln 2 * r^2/R_b^2)$. During exposure of the reverse field pattern, the adjusted forward scattered energy distribution is $A_{fa} * \exp(-\ln 2 * r^2/R_{fa}^2)$ and the associated adjusted backscattered energy distribution is $A_{ba} * \exp(-\ln 2 * r^2/R_{ba}^2)$. In order to approximate the backscattered energy distribution by the total adjusted energy distribution (ie. the sum of the adjusted forward scattered energy distribution and the adjusted backscattered energy distribution), $A_{ba}$ and $R_{ba}$ are selected to make the peak energy density and the total energy contained within the total adjusted energy distribution equal the peak energy density and total energy of the backscattered energy distribution. The equilization of energies assures that the backscattered energy distribution and the total adjusted energy distribution both make the same total contribution to the second component. If this were not the case then the amplitude at any points deep within the circuit pattern (ie. within the circuit pattern and over approximately 6 pixels from the reverse field pattern where the only contributions to the second component are from backscattered energy) would not equal the amplitude at any points deep within the reverse field pattern (ie. within the reverse field pattern and over 6 pixels from the circuit pattern where the only contributions to the second component are from the total adjusted energy). The peak energy densities are selected to be equal so that at points within approximately 6 pixels of any edge of the circuit pattern, the second component will be essentially constant.

The constraints on peak energy density and total energy require that:

$$A_b = A_{fa} + A_{ba} \text{ and} \tag{1}$$

$$A_b R_b^2 = A_{fa} R_{fa}^2 + A_{ba} R_{ba}^2 \tag{2}$$

These constraints can be solved for $A_{fa}$ and $R_{fa}$ by use of the following relations. First, the ratio of adjusted backscattered energy to adjusted forward scattered energy should equal the same fraction $n_E$ as the ratio between backscattered energy and forward scattered energy. That is:

$$A_{ba} R_{ba}^2 / A_{fa} R_{fa}^2 = n_E = A_b R_b^2 / A_f R_f^2 \tag{3}$$

Use of this in equation (2) implies that:

$$A_b R_b^2 = (1 + n_E) A_{fa} R_{fa}^2 \text{ and} \tag{4}$$

$$A_f R_f^2 = A_b R_b^2 / n_E = (1 + n_E) * A_{fa} R_{fa}^2 / n_E. \tag{5}$$

As mentioned above since the backscattered energy distribution is the convolution of the forward scattered energy distribution, then:

$$R_{ba}^2 - R_{fa}^2 = R_g^2 = R_b^2 - R_f^2. \tag{6}$$

Use of (1) and (6) in (2) yields:

$$A_b R_b^2 = A_{fa} R_{fa}^2 + A_{ba} R_{ba}^2 = A_{fa} R_{ba}^2 + (A_b - A_{fa})(R_b^2 + R_{fa}^2 - R_f^2)$$

which after cancellation of terms yields:

$$A_b(R_{fa}^2 - R_f^2) - A_{fa}(R_b^2 - R_f^2) = 0. \tag{7}$$

$A_b$ and $A_{fa}$ can be eliminated using equations (4) and (7) to yield:

$$(1 + n_E) R_{fa}^2 (R_{fa}^2 - R_f^2) - R_b^2 (R_b^2 - R_f^2) = 0. \tag{8}$$

Since the dose deposited is proportional to the total energy in the forward energy distribution, equation (5) requires that the charge per unit area $Q_a$ deposited by the adjusted beam is the fraction $nE/(1+nE)$ of the charge per unit area Q deposited by the beam used to draw the circuit pattern. That is:

$$Q_a = n_E Q / (1 + n_E). \tag{9}$$

This is equivalent to constraint (2) and insures that the amplitude of the second component deep inside the reverse field pattern will equal the amplitude deep inside the circuit pattern. Althogh equation (8) could be solved for $R_{fa}^2$, $R_f$ is much smaller than either $R_{fa}$ or $R_b$ and therefore equation (8) can be simplified by ignoring $R_f^2$ compared to $R_{fa}^2$ and $R_b^2$. Equation (8) then requires that:

$$R_{fa} = R_b / (1 + n_E)^{\frac{1}{4}}. \tag{10}$$

The imposition of constraints (9) and (10) on the adjusted beam during exposure of the reverse field pattern thus makes the second component essentially constant thereby removing the variability in resolution due to the proximity effect.

It is not essential to the process that the reverse field pattern be exposed subsequent to the exposure of the circuit pattern. Indeed, the reverse field pattern can be exposed first or it can even be exposed concurrently with the circuit pattern. For example, in a raster scan type of electron beam lithography machine, instead of blanking the beam over the reverse field pattern, the beam could instead be adjusted to produce the $Q_a$ and $R_{fa}$ indicated above. This technique would avoid the need to scan the wafer twice to expose both the circuit pattern and reverse field pattern. It should also be noted that the disclosed technique is applicable to vector scan machines and electron projection processes (See for example, J. P. Scott, "Electron Image Projector," *Solid State Technology,* May 1977, p. 43) as well as to raster scan machines.

The disclosed compensation technique in general compensates for the undesirable exposure of the resist by backscattered electrons and is not limited by any requirement that the resist be deposited directly on top of the substrate. Therefore, this technique is also applicable to multilayer lithography processes in which case the amount of washing out of the first component of exposure by the second essentially constant component is reduced compared to a single layer process. Indeed, the resist layer can be viewed as a workpiece in which a preselected pattern is to be exposed by a beam of particles. The technique compensates for undesirable backscatter into the workpiece whether the backscatter arises from scattering off of atoms in the substrate, from scattering off of atoms in intermediate layers in a multilayer process, or from scattering off of any other scattering site. The technique also does not rely on the mechanism by which the incidence of the beam on the workpiece results in the production of a pattern in the workpiece—it only relies on the observation that the particle beam produces an undesirable backscattered exposure of the workpiece which can undesirably affect the resolution of the pattern. It should also be noted that, although the technique is illustrated above for the case of a positive resist, it is clearly also applicable to processes using negative resists.

We claim:

1. An improved lithography method of the type in which particles are directed to impinge on preselected regions of a surface of a workpiece to expose in the workpiece a preselected pattern, said particles producing in the workpiece a total exposure which is the sum of a desired forward exposure to generate the preselected pattern and an undesired backscattered exposure, wherein the improvement comprises the additional step of exposing each pixel in the reverse field pattern with a flux of particles which produces in each of these pixels a total exposure that approximates the backscattered exposure produced in each pixel in the preselected regions, whereby a total exposure is produced that is the sum of the exposure due to the particles incident on the preselected regions and the exposure due to the particles incident on the reverse field pixels, said total exposure being the sum of a first component which is the ideal exposure which would result if there were no proximity effect and only the preselected regions were exposed and a second component which is essentially constant over the workpiece.

2. A method as recited in claim 1 of the type in which the particles impinge on the workpiece in the form of a beam of particles, and wherein the step of exposing each pixel of the reverse field pattern comprises the steps of:

adjusting the beam so that at each portion of the workpiece exposed by the adjusted beam, the total exposure approximates the backscattered exposure; and directing the adjusted beam to impinge on the regions of the workpiece contained in the reverse field pattern corresponding to said preselected pattern.

3. A method as in claim 2 wherein the beam of particles is an electron beam and wherein the workpiece is a layer of resist which is coated on top of a substrate and which is exposed by the passage of electrons through the resist.

4. A method as in claim 2 herein an intermediate electron absorbing layer is deposited between the layer of resist and the substrate.

5. A method as in claim 2 wherein the step of adjusting the beam comprises adjusting the width of the beam and the dose of charge impinging per unit area.

6. A method as in claim 5 wherein the dose and beam width are adjusted so that the total energy per unit area deposited in the reverse field pattern by the adjusted beam equals the backscattered energy per unit area deposited in the preselected pattern during generation of the preselected pattern.

7. A method as in claim 6 wherein the dose is adjusted by adjusting the current density of the beam.

8. A method as in claim 6 wherein the dose is adjusted by adjusting the writing speed of the beam.

* * * * *

UNITED STATES PATENT AND TRADEMARK OFFICE
CERTIFICATE OF CORRECTION

PATENT NO. : 4,463,265
DATED : July 31, 1984
INVENTOR(S) : Geraint Owen and Paul Rissman It is certified that error appears in the above—identified patent and that said Letters Patent is hereby corrected as shown below:

Column 5, line 8

Delete "2*R2/R2)" and insert --2*r2/R2)--

Signed and Sealed this

Eighth Day of October 1985

[SEAL]

Attest:

DONALD J. QUIGG

Attesting Officer

*Commissioner of Patents and Trademarks—Designate*